US010670536B2

(12) United States Patent
Plihal et al.

(10) Patent No.: US 10,670,536 B2
(45) Date of Patent: Jun. 2, 2020

(54) MODE SELECTION FOR INSPECTION (71) Applicant: KLA-Tencor Corporation, Milpitas, CA (US)

(72) Inventors: Martin Plihal, Pleasanton, CA (US); Saravanan Paramasivam, Chennai (IN); Ankit Jain, Ballston Spa, NY (US); Prasanti Uppaluri, Saratoga, CA (US); Raghavan Konuru, Andhra Pradesh (IN)

(73) Assignee: KLA-Tencor Corp., Milpitas, CA (US)

( * ) Notice: Subject to any disclaimer, the term of this patent is extended or adjusted under 35 U.S.C. 154(b) by 0 days.

(21) Appl. No.: 16/364,098

(22) Filed: Mar. 25, 2019

(65) Prior Publication Data
US 2019/0302031 A1    Oct. 3, 2019

Related U.S. Application Data (60) Provisional application No. 62/728,705, filed on Sep. 7, 2018.

(30) Foreign Application Priority Data

Mar. 28, 2018   (IN) ............................. 2018/41011800

(51) Int. Cl.
*G01N 21/88*    (2006.01)
*G01N 21/95*    (2006.01)
*G01N 21/956*   (2006.01)

(52) U.S. Cl.
CPC ..... *G01N 21/8851* (2013.01); *G01N 21/8806* (2013.01); *G01N 21/9501* (2013.01);
(Continued)

(58) Field of Classification Search
CPC .. G01N 21/00; G01N 21/956; G01N 21/9501; G01N 21/95607; G01N 21/8851; G01N 21/8806; G01N 21/88; G01N 21/892; G01N 21/896; G01N 21/93; G01N 21/94; G01N 21/95; G01N 21/9503;
(Continued)

(56) References Cited

U.S. PATENT DOCUMENTS 7,570,797 B1 *  8/2009  Wang ................. G01N 21/9501
                                                250/559.45
8,126,255 B2    2/2012  Bhaskar et al.
(Continued)

OTHER PUBLICATIONS

International Search Report and Written Opinion for PCT/US2019/024445 dated Jul. 5, 2019.

*Primary Examiner* — Christina A Riddle
(74) *Attorney, Agent, or Firm* — Ann Marie Mewherter (57) ABSTRACT

Methods and systems for selecting a mode for inspection of a specimen are provided. One method includes determining how separable defects of interest (DOIs) and nuisances detected on a specimen are in one or more modes of an inspection subsystem. The separability of the modes for the Dais and nuisances is used to select a subset of the modes for inspection of other specimens of the same type. Other characteristics of the performance of the modes may be used in combination with the separability to select the modes. The subset of modes selected based on the separability may also be an initial subset of modes for which additional analysis is performed to determine the final subset of the modes.

22 Claims, 3 Drawing Sheets (52) U.S. Cl.
CPC ... *G01N 21/956* (2013.01); *G01N 2021/8845* (2013.01); *G01N 2021/8854* (2013.01)

(58) Field of Classification Search
CPC .......... G01N 21/9505; G01N 23/225; G01N 2021/8887; G01N 2021/8845; G01N 2021/8854; G01N 2021/8858; G01N 2021/8861; G01N 2021/8864; G01N 2021/8867; G01N 2021/887; G01N 2021/8877; G01N 2021/888; G01N 2021/8883; G01N 2021/9563; G01N 2021/95676; G01N 2201/10; G06T 2207/30148; G06T 2207/10061; G06T 7/001; G06T 7/008; G06T 7/33; G06T 7/0004; G06T 7/0002–001; H01J 2237/2817; H01J 2237/2446; H01J 2237/2482; H01J 37/28; H01J 37/222; H01J 37/226; G03F 7/70483; G03F 7/70491; G03F 7/70608; G03F 7/70616; G03F 7/7065; G03F 7/70908; G03F 7/70916; G03F 7/70925; G05B 19/41875; H01L 22/12
USPC .......... 355/30, 53, 67–71, 72–77; 356/237.1, 356/239.1–239.3, 239.7, 239.8, 356/237.2–237.6; 250/492.1, 492.2, 250/492.21, 492.23, 492.22, 492.3, 493.1, 250/306, 310, 311; 382/181, 190, 192, 382/224–228, 108, 141, 144, 145, 149, 382/151
See application file for complete search history.

(56) References Cited

U.S. PATENT DOCUMENTS

| | | | |
|---|---|---|---|
| 8,664,594 B1 | 4/2014 | Jiang et al. | |
| 8,692,204 B2 | 4/2014 | Kojima et al. | |
| 8,698,093 B1 | 4/2014 | Gubbens et al. | |
| 8,716,662 B1 | 5/2014 | MacDonald et al. | |
| 9,222,895 B2 | 12/2015 | Duffy et al. | |
| 2003/0025904 A1* | 2/2003 | Sakai | G01N 21/94 356/237.2 |
| 2005/0052643 A1* | 3/2005 | Lange | G01N 21/9501 356/237.1 |
| 2006/0007434 A1 | 1/2006 | Furman et al. | |
| 2011/0050703 A1* | 3/2011 | Artan | G06T 7/11 345/440 |
| 2014/0133737 A1 | 5/2014 | Plihal et al. | |
| 2015/0042983 A1 | 2/2015 | Cohen-Erner | |
| 2015/0254832 A1 | 9/2015 | Plihal | |
| 2015/0262038 A1 | 9/2015 | Konuru | |
| 2015/0276618 A1 | 10/2015 | Plihal et al. | |
| 2016/0025648 A1 | 1/2016 | Duffy et al. | |
| 2016/0110857 A1 | 4/2016 | Plihal et al. | |
| 2016/0123898 A1* | 5/2016 | Chen | G01N 21/9501 |
| 2016/0258879 A1* | 9/2016 | Liang | G01N 23/20008 |
| 2017/0069075 A1* | 3/2017 | Okuda | G06K 9/6284 |
| 2017/0082555 A1 | 3/2017 | He et al. | |
| 2017/0140524 A1 | 5/2017 | Karsenti et al. | |
| 2017/0148226 A1 | 5/2017 | Zhang et al. | |
| 2017/0193400 A1 | 7/2017 | Bhaskar et al. | |
| 2017/0193680 A1 | 7/2017 | Zhang et al. | |
| 2017/0194126 A1 | 7/2017 | Bhaskar et al. | |
| 2017/0200260 A1 | 7/2017 | Bhaskar et al. | |
| 2017/0200264 A1 | 7/2017 | Park et al. | |
| 2017/0200265 A1 | 7/2017 | Bhaskar et al. | |
| 2017/0345140 A1 | 11/2017 | Zhang et al. | |
| 2017/0351952 A1 | 12/2017 | Zhang et al. | |
| 2018/0106732 A1 | 4/2018 | Plihal et al. | |
| 2018/0107928 A1 | 4/2018 | Zhang et al. | |
| 2018/0293721 A1 | 10/2018 | Gupta et al. | |
| 2018/0330511 A1 | 11/2018 | Ha et al. | |
| 2019/0005629 A1 | 1/2019 | Dandiana et al. | |
| 2019/0073568 A1 | 3/2019 | He et al. | |
| 2019/0333208 A1* | 10/2019 | Asbag | G06T 7/0006 |

* cited by examiner

MODE SELECTION FOR INSPECTION

BACKGROUND OF THE INVENTION

1. Field of the Invention

This invention generally relates to methods and systems for selecting a mode for inspection of a specimen

2. Description of the Related Art

The following description and examples are not admitted to be prior art by virtue of their inclusion in this section.

Inspection processes are used at various steps during a semiconductor manufacturing process to detect defects on wafers to promote higher yield in the manufacturing process and thus higher profits. Inspection has always been an important part of fabricating semiconductor devices. However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary since even relatively small defects may cause unwanted aberrations in the semiconductor devices.

Many different types of inspection systems have adjustable output acquisition (e.g., data, signal, and/or image acquisition) parameters such that different parameters can be used to detect different defects or avoid sources of unwanted (nuisance) events. Although an inspection system that has adjustable output acquisition parameters presents significant advantages to a semiconductor device manufacturer, these inspection systems are essentially useless if the incorrect output acquisition parameters are used for an inspection process. In addition, since the defects, process conditions, and noise on wafers may vary dramatically (and since the characteristics of the wafers themselves may vary dramatically), the best output acquisition parameters for detecting the defects on a particular wafer may be difficult, if not impossible, to predict. Therefore, although using the correct output acquisition parameters will have a dramatic effect on the results of inspection, it is conceivable that many inspection processes are currently being performed with incorrect or non-optimized output acquisition parameters.

Optics mode selection is preceded by defect discovery, which provides a set of defects and nuisances for the optics selector (OS) session. Defect discovery today is performed by scanning a setup specimen with a relatively diverse set of optics modes (typically around 10) and "hot detection thresholds" to improve the chances of discovering all defect types. The discovery itself largely relies on diversity sampling performed on the individual hot scans.

At the end of discovery, a set of the most important defects of interest (DOIs) and sensitivity limiting nuisances is chosen for OS session. This selection is performed by a human expert typically by choosing the smallest DOI examples (based on scanning electron microscope (SEM) images) and nuisances that show similarity to the DOIs based on optical patches and defect attributes.

The set of modes for OS may also be selected in largely haphazard ways using learned best known methods (BKMs), some theoretical rules for which modes should provide good signal for the defects identified during discovery, and experience and intuition of the person performing the OS analysis.

There are, however, a number of disadvantages to the currently used methods and systems for OS. For example, the currently used methods are entirely manual and subjective. The currently used methods and systems are also neither systematic nor exhaustive, and they are substantially time consuming. Another disadvantage of the currently used systems and methods is that they do not take defect and nuisance separability into account. In addition, the currently used systems and methods rely on a human expert's ability to sift through substantially large amounts of data to find the most relevant defect set, on which to perform the optics mode selection analysis. Furthermore, in the currently used methods and systems, human experts do not have the ability to process all of the information or the data volume to make the best decisions. Moreover, in the currently used methods and systems, only limited useful information is available to users to make decisions.

Accordingly, it would be advantageous to develop systems and/or methods for selecting a mode for inspection of a specimen that do not have one or more of the disadvantages described above.

SUMMARY OF THE INVENTION

The following description of various embodiments is not to be construed in any way as limiting the subject matter of the appended claims.

One embodiment relates to a system configured to select a mode for inspection of a specimen. The system includes an inspection subsystem configured for generating output for a specimen by scanning the specimen with energy and detecting energy from the specimen during the scanning. The inspection subsystem is also configured for generating the output with multiple modes defined by different values of at least one parameter of the inspection subsystem used for generating the output. The system also includes one or more computer subsystems configured for determining a separability score for each of one or more of the multiple modes thereby generating one or more separability scores. The separability score for each of the one or more modes is defined by a difference between results of a classifier for defects having a first defect of interest (DOI) type detected on the specimen using the output generated with one of the multiple modes and the results of the classifier for nuisances detected on the specimen using the output generated with the one of the multiple modes. The computer subsystem(s) are also configured for selecting a subset of the multiple modes of the inspection subsystem for inspection of other specimens of the same type as the specimen based on the one or more separability scores. The system may be further configured as described herein.

Another embodiment relates to a computer-implemented method for selecting a mode for inspection of a specimen. The method includes steps for each of the functions of the one or more computer subsystems described above. The steps of the method are performed by one or more computer subsystems. The method may be performed as described further herein. In addition, the method may include any other step(s) of any other method(s) described herein. Furthermore, the method may be performed by any of the systems described herein.

An additional embodiment relates to a non-transitory computer-readable medium storing program instructions executed on a computer system for performing a computer-implemented method for selecting a mode for inspection of a specimen. The computer-implemented method includes the steps of the method described above. The computer-readable medium may be further configured as described herein. The steps of the computer-implemented method may be performed as described further herein. In addition, the computer-implemented method for which the program instructions are executable may include any other step(s) of any other method(s) described herein.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

One embodiment relates to a system configured to select a mode for inspection of a specimen. Although some embodiments may be described herein with respect to optical (i.e., light based) modes, it is to be understood that the embodiments described herein may be used for selecting any other mode (e.g., electron beam, ion beam, x-ray, etc.) for inspection of a specimen such as a wafer or reticle. In one embodiment, the specimen includes a wafer. In another embodiment, the specimen includes a reticle. The wafer and the reticle may include any wafer and reticle known in the art. In addition, although some embodiments are described herein for selecting a mode for inspection, it is to be understood that the embodiments may select one or more modes that are ultimately used in the inspection.

Selecting optics mode(s) for inspection subsystems such as those included in broad band plasma (BBP) based tools that would optimize the detection of the most important defects of interest (DOIs) and reduce the nuisance rate in the inspection is one of the most important and challenging tasks during an inspection recipe setup. In an ideal scenario, the goal of optics selector (OS) is to find the best optics mode(s) that has/have the highest signal-to-noise ratio (S/N) for defects, detect(s) the defects reliably, as well as see(s) the least amount of nuisances in the inspection. This process, as it is performed today, is heavily manual and subjective. It relies on well-established best known methods (BKMs) and on a hierarchical approach to mode selection (focus offset→spectrum and aperture→pixel size and speed). It also requires non-trivial analysis of light sufficiency and so on to guarantee that the analysis of the optics modes is reliable. The input of OS is typically a list of defects that are used to guide the user towards the best optics mode(s). The input is substantially subjective depending on the user, as well. Typically, a user looks at the scanning electron microscope (SEM) images of the defects and chooses which defects to use for OS.

The embodiments described herein have a number of important differences from the currently used methods and systems for OS. For example, the embodiments described herein provide improved optics mode selection based on the results of adaptive discovery. The embodiments described herein also introduce quantitative analysis of defect discovery scans to guide the selection of optics modes for the OS session in a number of ways. For example, as described herein, the embodiments add defect and nuisance separability and optionally discovery efficiency to each defect type (or one or more defect types) and each discovery optics mode (or one or more discovery optics modes). The embodiments described herein may also use these metrics along with existing criteria to select the best defect set for an OS session. In addition, the embodiments described herein may, for each DOI type, provide defect and nuisance separability trends for the discovery modes.

"Nuisances" as that term is used herein are defects that a user does not care about and/or events that are detected but are not actually defects. Nuisances that are detected as events but are not actually defects may be detected due to non-defect noise sources on a specimen (e.g., line edge roughness (LER), relatively small critical dimension (CD) variation in patterned features, thickness variations, etc.) and/or due to marginalities in the inspection system itself or its configuration used for inspection. Generally, therefore, the goal of inspection is not to detect nuisances on specimens such as wafers.

Selecting the best mode(s) for inspection is one of the most critical steps for inspection (BBP inspection) to reach its sensitivity entitlement, and improving the ability to find the best mode for each defect type has the potential to significantly enhance the value of inspection tools. Today, optics mode selection is a substantially tedious, manual process, and it is far from exhaustive. The embodiments described herein will not only improve the time-to-result of OS, they will also improve the quality and comprehensiveness of mode selection.

Figure 1:
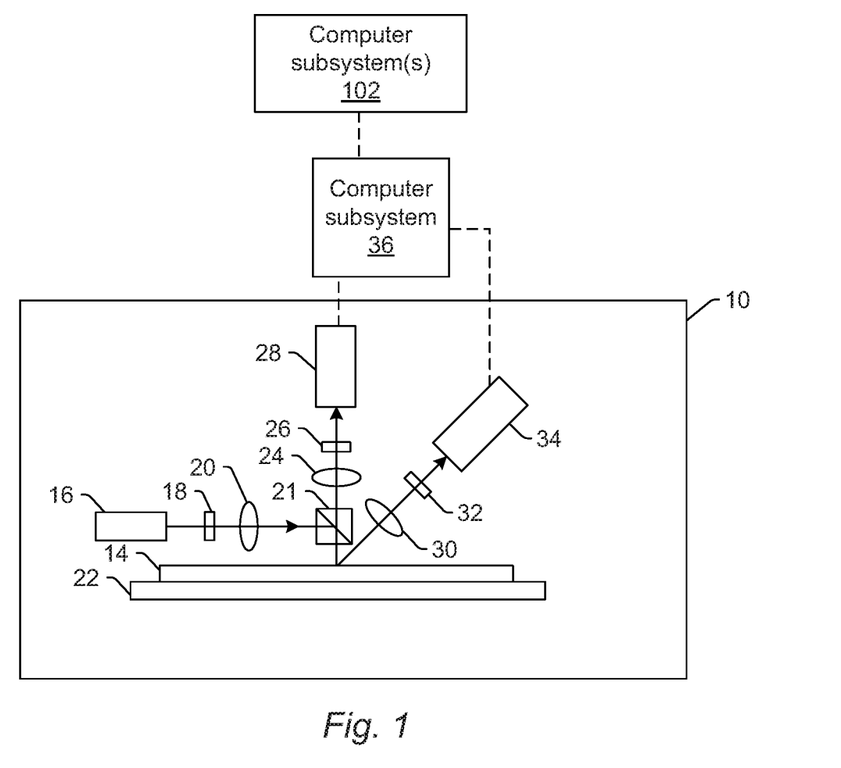
FIGS. 1 and 2 are schematic diagrams illustrating side views of embodiments of a system configured as described herein.

One embodiment of such a system is shown in FIG. 1. The system includes an inspection subsystem configured for generating output for a specimen by scanning the specimen with energy and detecting energy from the specimen during the scanning. As described further herein, the inspection subsystem is configured for generating the output with multiple modes defined by different values of at least one parameter of the inspection subsystem used for generating the output. The inspection subsystem may include at least an energy source and one or more detectors. The energy source is configured to generate energy that is directed to the specimen during the scanning. The one or more detectors are configured to detect energy from the specimen during the scanning and to generate the output responsive to the detected energy.

In one embodiment, the energy scanned over the specimen includes light, and the energy detected from the specimen includes light. For example, in the embodiment of the system shown in FIG. 1, inspection subsystem 10 includes an illumination subsystem configured to direct light to specimen 14. The illumination subsystem includes at least one light source. For example, as shown in FIG. 1, the illumination subsystem includes light source 16. In one embodiment, the illumination subsystem is configured to direct the light to the specimen at one or more angles of incidence, which may include one or more oblique angles and/or one or more normal angles. For example, as shown in FIG. 1, light from light source 16 is directed through optical element 18 and then lens 20 to beam splitter 21, which directs the light to specimen 14 at a normal angle of incidence. The angle of incidence may include any suitable angle of incidence, which may vary depending on, for instance, characteristics of the specimen and the defects to be detected on the specimen.

The illumination subsystem may be configured to direct the light to the specimen at different angles of incidence at different times. For example, the inspection subsystem may be configured to alter one or more characteristics of one or more elements of the illumination subsystem such that the light can be directed to the specimen at an angle of incidence that is different than that shown in FIG. 1. In one such example, the inspection subsystem may be configured to move light source 16, optical element 18, and lens 20 such that the light is directed to the specimen at a different angle of incidence.

In some instances, the inspection subsystem may be configured to direct light to the specimen at more than one angle of incidence at the same time. For example, the illumination subsystem may include more than one illumination channel, one of the illumination channels may include light source 16, optical element 18, and lens 20 as shown in FIG. 1 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen at different angles of incidence may be different such that light resulting from illumination of the specimen at the different angles of incidence can be discriminated from each other at the detector(s).

In another instance, the illumination subsystem may include only one light source (e.g., source 16 shown in FIG. 1) and light from the light source may be separated into different optical paths (e.g., based on wavelength, polarization, etc.) by one or more optical elements (not shown) of the illumination subsystem. Light in each of the different optical paths may then be directed to the specimen. Multiple illumination channels may be configured to direct light to the specimen at the same time or at different times (e.g., when different illumination channels are used to sequentially illuminate the specimen). In another instance, the same illumination channel may be configured to direct light to the specimen with different characteristics at different times. For example, in some instances, optical element 18 may be configured as a spectral filter and the properties of the spectral filter can be changed in a variety of different ways (e.g., by swapping out the spectral filter) such that different wavelengths of light can be directed to the specimen at different times. The illumination subsystem may have any other suitable configuration known in the art for directing the light having different or the same characteristics to the specimen at different or the same angles of incidence sequentially or simultaneously.

In one embodiment, light source 16 may include a BBP light source. In this manner, the light generated by the light source and directed to the specimen may include broadband light. However, the light source may include any other suitable light source such as a laser, which may include any suitable laser known in the art and may be configured to generate light at any suitable wavelength(s) known in the art. In addition, the laser may be configured to generate light that is monochromatic or nearly-monochromatic. In this manner, the laser may be a narrowband laser. The light source may also include a polychromatic light source that generates light at multiple discrete wavelengths or wavebands.

Light from optical element 18 may be focused to beam splitter 21 by lens 20. Although lens 20 is shown in FIG. 1 as a single refractive optical element, it is to be understood that, in practice, lens 20 may include a number of refractive and/or reflective optical elements that in combination focus the light from the optical element to the specimen. The illumination subsystem shown in FIG. 1 and described herein may include any other suitable optical elements (not shown). Examples of such optical elements include, but are not limited to, polarizing component(s), spectral filter(s), spatial filter(s), reflective optical element(s), apodizer(s), beam splitter(s), aperture(s), and the like, which may include any such suitable optical elements known in the art. In addition, the system may be configured to alter one or more of the elements of the illumination subsystem based on the type of illumination to be used for inspection.

The inspection subsystem may also include a scanning subsystem configured to cause the light to be scanned over the specimen. For example, the inspection subsystem may include stage 22 on which specimen 14 is disposed during inspection. The scanning subsystem may include any suitable mechanical and/or robotic assembly (that includes stage 22) that can be configured to move the specimen such that the light can be scanned over the specimen. In addition, or alternatively, the inspection subsystem may be configured such that one or more optical elements of the inspection subsystem perform some scanning of the light over the specimen. The tight may be scanned over the specimen in any suitable fashion.

The inspection subsystem further includes one or more detection channels. At least one of the one or more detection channels includes a detector configured to detect light from the specimen due to illumination of the specimen by the inspection subsystem and to generate output responsive to the detected light. For example, the inspection subsystem shown in FIG. 1 includes two detection channels, one formed by collector 24, element 26, and detector 28 and another formed by collector 30, element 32, and detector 34. As shown in FIG. 1, the two detection channels are configured to collect and detect light at different angles of collection. In some instances, one detection channel is configured to detect specularly reflected light, and the other detection channel is configured to detect light that is not specularly reflected (e.g., scattered, diffracted, etc.) from the specimen. However, two or more of the detection channels may be configured to detect the same type of light from the specimen (e.g., specularly reflected light). Although FIG. 1 shows an embodiment of the inspection subsystem that includes two detection channels, the inspection subsystem may include a different number of detection channels (e.g., only one detection channel or two or more detection channels).

Although each of the collectors are shown in FIG. 1 as single refractive optical elements, it is to be understood that each of the collectors may include one or more refractive optical element(s) and/or one or more reflective optical element(s).

The one or more detection channels may include any suitable detectors known in the art such as photo-multiplier tubes (PMTs), charge coupled devices (CCDs,), and time delay integration (TDI) cameras. The detectors may also include non-imaging detectors or imaging detectors. If the detectors are non-imaging detectors, each of the detectors may be configured to detect certain characteristics of the light such as intensity but may not be configured to detect such characteristics as a function of position within the imaging plane. As such, the output that is generated by each of the detectors included in each of the detection channels of the inspection subsystem may be signals or data, but not image signals or image data. In such instances, a computer subsystem such as computer subsystem 36 of the system may be configured to generate images of the specimen from the non-imaging output of the detectors. However, in other instances, the detectors may be configured as imaging detectors that are configured to generate image signals or image data. Therefore, the system may be configured to generate the output described herein in a number of ways.

It is noted that FIG. 1 is provided herein to generally illustrate a configuration of an inspection subsystem that may be included in the system embodiments described herein. Obviously, the inspection subsystem configuration described herein may be altered to optimize the performance of the system as is normally performed when designing a commercial inspection system. In addition, the systems described herein may be implemented using an existing inspection system (e.g., by adding functionality described herein to an existing inspection system) such as the 28xx and 29xx series of tools that are commercially available from KLA, Milpitas, Calif. For some such systems, the methods described herein may be provided as optional functionality of the system (e.g., in addition to other functionality of the system). Alternatively, the system described herein may be designed "from scratch" to provide a completely new system.

Computer subsystem 36 of the system may be coupled to the detectors of the inspection subsystem in any suitable manner (e.g., via one or more transmission media, which may include "wired" and/or "wireless" transmission media) such that the computer subsystem can receive the output generated by the detectors during scanning of the specimen. Computer subsystem 36 may be configured to perform a number of functions using the output of the detectors as described herein and any other functions described further herein. This computer subsystem may be further configured as described herein.

This computer subsystem (as well as other computer subsystems described herein) may also be referred to herein as computer system(s). Each of the computer subsystem(s) or system(s) described herein may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer platform with high speed processing and software, either as a standalone or a networked tool.

If the system includes more than one computer subsystem, then the different computer subsystems may be coupled to each other such that images, data, information, instructions, etc. can be sent between the computer subsystems as described further herein. For example, computer subsystem 36 may be coupled to computer subsystem(s) 102 (as shown by the dashed line in FIG. 1) by any suitable transmission media, which may include any suitable wired and/or wireless transmission media known in the art. Two or more of such computer subsystems may also be effectively coupled by a shared computer-readable storage medium (not shown).

Although the inspection subsystem is described above as being an optical or light-based inspection subsystem, the inspection subsystem may be an electron beam-based inspection subsystem. For example, in one embodiment, the energy scanned over the specimen includes electrons, and the energy detected from the specimen includes electrons. In this manner, the energy source may be an electron beam source. In one such embodiment shown in FIG. 2, the inspection subsystem includes electron column 122, which is coupled to computer subsystem 124.

Figure 2:
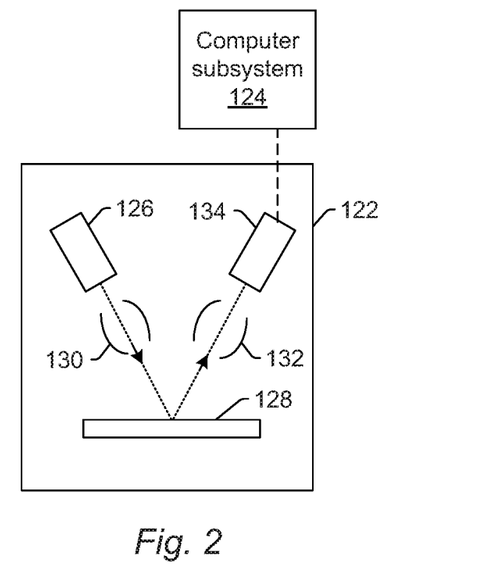

As also shown in FIG. 2, the electron column includes electron beam source 126 configured to generate electrons that are focused to specimen 128 by one or more elements 130. The electron beam source may include, for example, a cathode source or emitter tip, and one or more elements 130 may include, for example, a gun lens, an anode, a beam limiting aperture, a gate valve, a beam current selection aperture, an objective lens, and a scanning subsystem, all of which may include any such suitable elements known in the art.

Electrons returned from the specimen (e.g., secondary electrons) may be focused by one or more elements 132 to detector 134. One or more elements 132 may include, for example, a scanning subsystem, which may be the same scanning subsystem included in element(s) 130.

The electron column may include any other suitable elements known in the art. In addition, the electron column may be further configured as described in U.S. Pat. No. 8,664,594 issued Apr. 4, 2014 to Jiang et al., U.S. Pat. No. 8,692,204 issued Apr. 8, 2014 to Kojima et al., U.S. Pat. No. 8,698,093 issued Apr. 15, 2014 to Gubbens et al., and U.S. Pat. No. 8,716,662 issued May 6, 2014 to MacDonald et al., which are incorporated by reference as if fully set forth herein.

Although the electron column is shown in FIG. 2 as being configured such that the electrons are directed to the specimen at an oblique angle of incidence and are detected from the specimen at another oblique angle, the electron beam may be directed to and detected from the specimen at any suitable angles. In addition, the electron beam-based subsystem may be configured to use multiple modes to generate images of the specimen (e.g., with different illumination angles, collection angles, etc.). The multiple modes of the electron beam subsystem may be different in any image generation parameters of the subsystem.

Computer subsystem 124 may be coupled to detector 134 as described above. The detector may detect electrons returned from the surface of the specimen thereby forming electron beam images of the specimen. The electron beam images may include any suitable electron beam images. Computer subsystem 124 may be configured to perform any of the functions described herein using the output of the detector and/or the electron beam images. Computer subsystem 124 may be configured to perform any additional step(s) described herein. A system that includes the inspection subsystem shown in FIG. 2 may be further configured as described herein.

FIG. 2 is provided herein to generally illustrate a configuration of an electron beam inspection subsystem that may be included in the embodiments described herein. As with the optical inspection subsystem described above, the electron beam inspection subsystem configuration described herein may be altered to optimize the performance of the inspection subsystem as is normally performed when designing a commercial inspection system. In addition, the systems described herein may be implemented using an existing inspection system (e.g., by adding functionality described herein to an existing inspection system). For some such systems, the methods described herein may be provided as optional functionality of the system (e.g., in addition to other functionality of the system). Alternatively, the system described herein may be designed "from scratch" to provide a completely new system.

Although the inspection subsystem is described above as being a light- or electron beam-based inspection subsystem, the inspection subsystem may be an ion beam-based inspection subsystem. Such an inspection subsystem may be configured as shown in FIG. 2 except that the electron beam source may be replaced with any suitable ion beam source known in the art. In addition, the inspection subsystem may be any other suitable ion beam-based subsystem such as those included in commercially available focused ion beam (FIB) systems, helium ion microscopy (HIM) systems, and secondary ion mass spectroscopy (SIMS) systems.

As noted above, the inspection subsystem is configured for scanning energy light, electrons, etc.) over a physical version of the specimen thereby generating actual output or images for the physical version of the specimen. In this manner, the inspection subsystem may be configured as an "actual" tool, rather than a "virtual" tool. A storage medium (not shown) and computer subsystem(s) 102 shown in FIG. 1 may be configured as a "virtual" tool. Systems and methods configured as "virtual" inspection tools are described in commonly assigned U.S. Pat. No. 8,126,255 issued on Feb. 28, 2012 to Bhaskar et al. and U.S. Pat. No. 9,222,895 issued on Dec. 29, 2015 to Duffy et al., both of which are incorporated by reference as if fully set forth herein. The embodiments described herein may be further configured as described in these patents. For example, the one or more computer subsystems described herein may be further configured as described in these patents.

As further noted above, the inspection subsystem is configured to generate output for the specimen with multiple modes. In general, a "mode" can be defined by the values of parameters of the inspection subsystem used for generating output (e.g., images) for a specimen. Therefore, modes that are different may be different in the values for at least one of the imaging parameters of the inspection subsystem. For example, in an optical inspection subsystem, different modes may use at least one different wavelength of light for illumination. The modes may be different in the illumination wavelengths as described further herein (e.g., by using different light sources, different spectral filters, etc.) for different modes. In another embodiment, different modes uses different illumination channels of the inspection subsystem. For example, as noted above, the inspection subsystem may include more than one illumination channel. As such, different illumination channels may be used for different modes. The modes may also or alternatively be different in one or more collection/detection parameters of the inspection subsystem. The inspection subsystem may be configured to scan the specimen with the different modes in the same scan or different scans, e.g., depending on the capability of using multiple modes to scan the specimen at the same time.

The embodiments described herein provide a new optics mode selection setup analyzer (OMSSA). The new OMSSA is configured to have one or more critical capabilities that are missing today. For example, the embodiments provide quantitative analysis of optics modes from discovery scans.

The one or more computer subsystems are configured for determining a separability score for each of one or more of the multiple modes thereby generating one or more separability scores. The separability score for each of the one or more modes is defined by a difference between results of a classifier for defects having a first defect of interest (DOI) type detected on the specimen using the output generated with one of the multiple modes and the results of the classifier for nuisances detected on the specimen using the output generated with the one of the multiple modes. Therefore, the embodiments described herein may use a defect-nuisance separability score as an OS metric.

A separability score may be determined for each combination (or one or more combinations) of a DOI type and an optical mode. Each separability score may be determined for only one DOI type such as bridges (and not other DOI types such as residue, missing features, etc.), or each separability score may be determined for more than one DOI type (e.g., all of the DOIs having any type). Therefore, the determined separability score(s) may include a separability score for a first defect type and a first optical mode, the first defect type and a second optical mode, . . . , the first defect type and an $n^{th}$ optical mode and possibly other separability scores such as a separability score for a second defect type and the first optical mode, the second defect type and the second optical mode, and so on. In addition or alternatively, the separability score(s) may include a separability score for all DOIs and a first optical mode, all the DOIs and a second optical mode, etc.

The computer subsystem(s) may determine the separability score(s) by training a classifier (or nuisance filter) and then determining the "margin" the classifier has for DOI-nuisance separation. The "margin" can be thought of as the "average distance" of DOIs from nuisances in the classification (or nuisance filter) space. The margin may also be quantified in another manner such as median, mean, robust average, etc. distance between DOIs and nuisances in the classification (or nuisance filter) space. In one example, this distance may be measured in terms of classification confidence (the more confident the classifier is in classifying nuisances as nuisances and DOIs as DOIs, the higher the margin). In other words, the classification confidence measures the perpendicular distance to the classification boundary (in some arbitrary, but consistent units), which separates one group of events (those determined to be DOIs) from another group of detected events (those determined to be nuisances).

In a specific example, the classifier may be configured such that if the confidence=0, that means that an event is determined to be a nuisance with high confidence and if the confidence=1, then that means that an event is determined to be a DOI with high confidence. In this example, the computer subsystem(s) may find the average confidence of all DOIs (specific types) and subtract that from the confidence value at which the nuisance floor appears (this typically shows up as a relatively sharp onset of defectivity at a particular confidence value). It would be the value of this difference that the computer subsystem(s) would track across optics modes. The higher the value, the higher the separability. Depending on the configuration of the classifier, the computer subsystem(s) may consider a set of signal attributes (after defect segmentation) instead of confidence, but otherwise the computer subsystem(s) may perform this step as described herein.

In some embodiments, the computer subsystem(s) are configured for detecting events on the specimen using the output generated during the scanning with the multiple triodes and for inputting the events into the classifier to thereby separate the events into the defects and the nuisances. For example, the embodiments described herein may be configured to perform one or more discovery scans of the specimen meant to "discover" defects and nuisances on the specimen). The discovery scan(s) may include one or more scans i.e., a scan with optics mode 1, . . . , a scan with optics mode n). The scans may be performed as described further herein using any of the embodiments of the inspection subsystem described herein.

The one or more computer subsystems may be configured for detecting events on the specimen based on the output generated by one or more detectors of the inspection subsystem during the scanning with the multiple modes. The events may be detected on the specimen in any suitable manner (e.g., by applying a threshold to the output and identifying output having one or more values above the threshold as an event and not identifying output having one or more values below the threshold as an event). The defects and nuisances into which the events detected on the specimen are separated may include any defects and nuisances known in the art.

Defect discovery today is performed by scanning a setup specimen with a relatively diverse set of optics modes (typically around 10) and "hot detection thresholds" to improve the chances of discovering all defect types. The discovery itself largely relies on diversity sampling performed on the individual hot scans. A "hot" threshold can be generally defined as a threshold that is at, within, or substantially near the noise floor of the output generated by the inspection subsystem for the specimen. In this manner, the event detection can be quite a bit more aggressive (hotter) than would normally be performed for a tuned inspection recipe, so that more events, including defects and nuisance events, are detected above desired in a tuned inspection. In this manner, such scans would not normally be useful for production monitoring due to the substantially high nuisance defect detection.

In one embodiment, the classifier is configured as a nuisance filter. For example, the classifier may be configured as a nuisance filter and/or defect classifier. The configuration of the classifier may vary depending on the inspection and/or specimen for which OS is being performed. The classifier may label detected events as actual defects, nuisances, and not-actual defects (e.g., noise). If the classifier is a nuisance filter, then the classifier may label detected events as actual defects and nuisances (which can be generally defined as described further herein as noise and/or actual defects that the user does not actually care about). If the classifier is a defect classifier, then the classifier may label the detected events with defect IDs, e.g., class codes, that indicate different types of defects such as bridges, particles, scratches, missing features, roughness, etc. Defect classifiers may also label defects with a particular type of defect and also separate them from nuisances thereby functioning as a defect classifier and nuisance filter.

The classifier and/or nuisance filter may include various types of classifiers and nuisance filters. For example, the classifier or nuisance filter may be configured as a decision tree or a random forest type classifier. The classifier and nuisance filter may also be a machine learning type of classifier or nuisance filter. In this manner, the classifier and nuisance filter may be a machine learning model. The classifier and nuisance filter may also include any other type of automatic defect classifier (ADC) known in the art. Additional examples of classifiers that may be used as the classifier and nuisance filter in the embodiments described herein are described in U.S. Patent Application Publication No. 2015/0254832 by Plihal published Sep. 10, 2015, 2015/0262038 by Konuru published Sep. 17, 2015, 2016/0258879 by Liang et al. published Sep. 8, 2016, and 2017/0082555 by He et al. published Mar. 23, 2017, which are incorporated by reference as if fully set forth herein. The classifiers described herein may be configured as described in these publications.

The machine learning model may include any deep learning model known in the art, including for example, a neural network, a convolutional neural network, a generative model, etc. Examples of suitable machine learning models that may be used as the classifier in the embodiments described herein are described in commonly owned U.S. Patent Application Publication No. 2017/0140524 published May 18, 2017 by Karsenti et al., 2017/0148226 published May 25, 2017 by Zhang et al., 2017/0193400 published Jul. 6, 2017 by Bhaskar et al., 2017/0193680 published Jul. 6, 2017 by Zhang et al., 2017/0194126 published Jul. 6, 2017 by Bhaskar et al., 2017/0200260 published Jul. 13, 2017 by Bhaskar et al., 2017/0200264 published Jul. 13, 2017 by Park et al., 2017/0200265 published Jul. 13, 2017 by Bhaskar et al., 2017/0345140 published Nov. 30, 2017 by Zhang et al., 2017/0351952 published Dec. 7, 2017 by Zhang et al., 2018/0107928 published Apr. 19, 2018 by Zhang et al., 2018/0293721 published Oct. 11, 2018 by Gupta et al., 2018/0330511 published Nov. 15, 2018 by Ha et al., 2019/0005629 published Jan. 3, 2019 by Dandiana et al., and 2019/0073568 published Mar. 7, 2019 by He et al., which are incorporated by reference as if fully set forth herein. The embodiments described herein may be further configured as described in these publications. In addition, the embodiments described herein may be configured to perform any steps described in these publications.

In one embodiment, the computer subsystem(s) are configured for detecting events on the specimen using the output generated during the scanning with the multiple modes as input to a defect detection method, inputting the events into the classifier to thereby separate the events into the defects and the nuisances, altering one or more parameters of the defect detection method, repeating the detecting the events step with the one or more altered parameters of the defect detection method, and inputting the events detected by the detecting step and the repeating the detecting step into the classifier to thereby separate the events into the defects and the nuisances. In this manner, the event detection (and thereby defect detection) may be altered in a kind of in situ or feedback loop during event detection, e.g., to detect more events, defects, and nuisances and/or to try to detect different kinds of events, defect, and nuisances.

The embodiments described herein may therefore be configured for adaptive discovery. The computer subsystem(s) may perform adaptive discovery independently on each mode while cross-auto-labeling discovered defects to all modes. Cross-auto-labeling may include labeling all of the images generated by any two or more of the modes at the same location at which a defect was detected defect images. For example, if a first mode detects a defect at location x, the computer subsystem(s) may label any other images generated with any other modes at location x as defect images regardless of whether those other modes detected the defect at location x. Adaptive discovery uses active learning and a classifier. At the end of discovery, adaptive discovery may produce a converged classifier that can be applied as a nuisance filter to the inspection with the corresponding optics modes.

Adaptive discovery and/or finding defects and nuisances on the specimen for use in the embodiments described herein may be performed as described in the above-referenced publication by He et al. In addition, the embodiments described herein may be configured for discovering and/or finding defects and nuisances that can be used as a training set for additional steps described herein as described in U.S. Patent Application Publication No. 2014/0133737 by Plihal et al. published May 15, 2014, 2015/0276618 by Plihal et al. published Oct. 1, 2015, 2016/0110857 by Plihal et al. published Apr. 21, 2016, 2016/0123898 by Chen et al. published May 5, 2016, and 2018/0106732 by Plihal et al, published Apr. 19, 2018, which are incorporated by reference as if fully set forth herein. The embodiments described herein may be further configured as described in these publications.

In one such embodiment, altering the one or more parameters of the defect detection method includes identifying a portion of the multiple modes expected (or known) to be capable of detecting the defects in greater numbers than another portion of the multiple modes and selecting only the output generated during the scanning performed with the identified portion of the multiple modes as the input to the defect detection method. The "portion" of the multiple modes may include one or more of the multiple modes and in this case fewer than all of the multiple modes. The computer subsystem(s) may perform such identifying and selecting to drive the defect discovery process to convergence and data sufficiency in mode(s) that have capability to detect the defects. For example, the one or more computer subsystem(s) may analyze classifier convergence on each mode. In addition, the one or more computer subsystems may analyze the data sufficiency of each of the important defect types. For example, the performance of classifiers (such as machine learning classifiers described further herein) improves with the size of the training set up to a certain point beyond which the classifier reaches its optimal performance on the data. It is, therefore, advantageous to provide "sufficient" training data to reach this optimal performance of the classifier. That point may be commonly referred to as "data sufficiency." The computer subsystem(s) may measure data sufficiency by monitoring the "convergence" of the classifier as the training set is increased by the computer subsystem(s). The "convergence" of the classifier may be determined and monitored in any suitable manner known in the art. The computer subsystem(s) may monitor and alter the discovery process to meet the data sufficiency threshold because when comparing DOI-to-nuisance separability of different modes, the DOIs and nuisances are preferably classified by a classifier that has converged to get substantially accurate data for other steps (OS) performed using the data.

As described further above, in some embodiments, the computer subsystem(s) are configured for detecting events on the specimen using the output generated during the scanning with the multiple modes and for inputting the events into the classifier to thereby separate the events into the defects and the nuisances. In one such embodiment, the computer subsystem(s)) are configured for displaying the defects and the nuisances to a user and receiving a selection of one or more of the defects and one or more of the nuisances from the user. For example, during the discovery analyzer (OMSSA) phase, the computer subsystem(s) may be configured for diagnostics and visualization of discovery results. In the diagnostics and visualization of discovery results phase, a user may identify important DOI types.

The computer subsystem(s) may display the defects and nuisances to the user using any suitable graphical user interface (GUI) on any suitable display device (not shown). The computer subsystem(s) may also display the defects and nuisances in a variety of different ways, e.g., displaying the defects and nuisances in groups based on which mode detected them, displaying subgroups of the defects and nuisances that have one or more similar characteristics such as size, location in a design for the specimen, shape, texture, grey level intensity, etc. In general, the computer subsystem(s) may display any results generated for the defects and nuisances (including patch images (i.e., relatively small images grabbed at the locations of the defects and nuisances) and any characteristics of the defects and nuisances determined by the computer subsystem(s) or the classifier). The computer subsystem(s) may receive the selection of the defect(s) and nuisance(s) from the user with any suitable input device (not shown) such as a keyboard, mouse, touch screen, electronic pen, etc. The computer subsystem(s) may also display one or more options for the user such as one or more tags or labels that can be assigned to the defects or nuisances to indicate which ones are important and which ones are not.

In some such embodiments, the computer subsystem(s) are configured for receiving input from the user indicating which of the one or more of the defects have the same type. This input may be received by the computer subsystem(s) in the same manner as described above (e.g., using an input device manipulated by the user possibly with one or more options displayed in the display device). In the diagnostics and visualization of discovery results phase, a user may identify important DOI types and group them based on similarity. In general, a "group" of DOIs may be the same as a "type" of DOI. However, the user does not necessarily have to organize the DOIs by type in this step. For example, the user may group DOIs based on similarity (e.g., how similar they look to a user and/or if the user thinks they may have the same DOI type), but the user may also choose (knowingly or unknowingly) to group DOIs that are similar in some respects even if they have different DOI types. In this manner, the term "DOI group" may be used interchangeably with the term DOI type, some examples of which include vertical tip-to-tip bridge, horizontal open, residue, etc. However, when it comes to manual grouping, the (manual) classification assigned to the defects does not always align with the types for OS. In any case, the embodiments described herein may be configured to allow the user to group the defects in any manner that they would like and can analyze any such defect groupings as described herein. The defect groupings input by the user may also be modified by the classifier when the defects in the user assigned groups are input to the classifier. The user also may or may not indicate which of the nuisances have the same type and/or may group one or more of the nuisances. The types or groups of nuisances may include, for example, a group of nuisances that the user labels as actual defects that the user does not care about, a group of nuisances that the user labels as noise, etc. In any of the embodiments described herein, the user may also configure the desired number of defects (and possibly nuisances) for OS session image grabs. In this manner, the user may perform "similarity of types" grouping and then decide which defect type(s) should be used in OS to select the mode.

In another such embodiment, the computer subsystem(s) are configured for determining another separability score for each of the one or more of the defect types selected by the user thereby generating one or more other separability scores, and the other separability score for each of the one or more of the defects is defined by a difference between the results of the classifier for one of the defects selected by the user and detected on the specimen using the output generated with the one of the multiple modes compared to the results of the classifier for the nuisances detected on the specimen using the output generated with the one of the modes. For example, the one or more computer subsystem(s) may determine a separability score for each important DOI type selected by the user on each mode. In other words, the separability scores described herein may be determined on a DOI-to-DOI basis (or per DOI) and for each of the different modes. As such, a separability score may be determined for a first DOI detected in a first optical mode, the first DOI detected in a second optical mode, and so on, and the separability score may be determined for a second DOI detected in the first optical mode, the second DOI detected in the second optical mode, and so on for as many combinations of DOIs and optics modes that are interesting and/or selected as described herein.

These and other separability scores described herein may also be determined for one or more DOIs compared to all of the nuisances detected with a mode in which the one or more DOIs were detected. For example, in order for an optics mode to be able to detect all (or as many) of the DOI instances that it can, each (or at least many) of the DOI instances must be separable from all of the nuisances in that mode (otherwise when the inspection is setup for that mode, it will be impossible to detect DOIs without also detecting nuisances and to not detect any nuisances without also missing DOIs). Therefore, the separability scores described herein may be determined for one or more DOIs compared to all of the nuisances detected in the same mode as the DOIs for which the separability scores are being determined.

In one such embodiment, the computer subsystem(s) are configured for selecting a subset of the one or more of the defects selected by the user based on the one or more other separability scores to thereby select at least one of the one or more of the defects having the lowest values of the one or more other separability scores, and selecting the subset of the multiple modes is performed based on the one or more separability scores in combination with the one or more other separability scores. The subset of the one or more of the defects may include a single defect, one or more of the defects, a portion of the defects, or even a substantial portion of the defects. For example, based on the other separability scores, the computer subsystem(s) may generate a ranked list of the best defect candidates for each important DOI group. In particular, the best DOIs for OS will typically be defects that have a relatively low confidence of being DOI, i.e., low separability (confidence) values. These defects may be selected for use in OS because those are the defects that are relatively difficult to separate from nuisances. These defects tend to be relatively small defects that are difficult to detect (e.g., due to relatively weak signals). It would therefore be advantageous to include those defects in the ones considered during OS so that an optics mode that maximizes the signal to such defects (and/or separability of such defects from nuisances) can be found in OS. In addition, based on the other separability scores, the computer subsystem(s) may generate a more detailed breakdown of DOI examples with the sensitivity-limiting nuisance examples by optics mode (i.e., different nuisance sources limit sensitivity to the DOT in different modes). In this manner, the computer subsystem(s) may be configured to perform a comprehensive analysis of the user-selected DOI types to identify the best set of DOI and nuisance events for all of the candidate modes from discovery scans.

In this manner, the embodiments described herein may select the best set (or subset) of defects for OS session. As described further herein, the OMSSA may also rank one or more of the optics modes for OS analysis. The selected set of defects (and possibly nuisances) along with the selected set (or subset) of optics modes may be used for OS as described further herein. In the embodiments described herein, the computer subsystem(s) may perform fully automated defect selection and mode ranking. However, the embodiments described herein may also be implemented with a more interactive approach for adjusting the search criteria and output (search criteria refers to the automated way of selecting defects for OS). In addition, the integration of OMSSA and OS may vary from that described herein (e.g., so that they are entirely integrated to function seamlessly together as a single unit (as in a single software package or module), they are closely integrated so that they appear to function as a single unit even though they are different units, or they may be more loosely integrated so that they appear to function as different units and/or are configured as different units). For example, there may be a more or less interactive and adaptive link between OMSSA and OS image collection flows.

In one embodiment, the computer subsystem(s) are configured for determining a discovery efficiency for each of the one or more of the multiple modes thereby generating one or more discovery efficiencies, and the discovery efficiency for each of the one or more modes is defined by a number of DOIs captured using the output generated with one of the modes. "Discovery efficiency" as that term is used herein can therefore also be defined as how many DOIs were actually captured in the mode at the end of the discovery process. Therefore, in a way, discovery efficiency and separability may go hand-in-hand. (e.g., a mode that achieves a better DOI-nuisance separation than other modes will also generally be capable of a higher discovery efficiency than the other modes). In addition, the computer subsystem(s) may use the discovery efficiency scores based on the data generated during adaptive discovery for defect selection for OS and for ranking optics modes, which may be performed as described further herein.

In some embodiments, the computer subsystem(s) are configured for determining a characteristic of the one or more separability scores for at least a portion of the multiple modes. The characteristic may be, for example, a trend in one or more of the quantitative measures described herein. For example, the characteristic may be an optics mode trend quantified through separability strength (DOI-nuisance separability) and optionally discovery efficiency for each of the important DOI types. In another example, the computer subsystem(s) may provide mode separability trends and/or separability trends for one or more DOIs types. These trends can be used to aid the mode selection for OS session. In addition, the computer subsystem(s) may provide optics mode trends for each DOI group in terms of signal, DOI-nuisance separability, and discovery efficiency. The trends may be expressed or even quantified based on a change in one or more of the scores or quantitative measures described herein as a function of mode. So the trends may show how much a score or measure changes from mode to mode. The trends may also show how much a score or measure changes from mode to mode in a particular direction (from highest to lowest or vice versa). Different scores or measures may be expressed or quantified in different directions depending on what they are. For example, trends may be used to characterize the optics modes from best to worst by showing the trends from highest to lowest DOI-nuisance separability and/or highest to lowest discovery efficiency, but that is not always the case. In one such example, a trend characterizing the optics modes from best to worst may be determined based on the score or quantitative measure from lowest to highest (e.g., if the optics modes are being examined for trends in amounts of nuisances detected in the optics modes). The trends may be generated, described, demonstrated, quantified, etc. in any suitable manner, e.g., graphically, sorted in list form in a data structure, etc.

The one or more computer subsystems are further configured for selecting a subset of the multiple modes of the inspection subsystem for inspection of other specimens of the same type as the specimen based on the one or more separability scores. Selecting the subset of the multiple modes that will actually be used for the inspection of the other specimens may be performed as described further herein. For example, the OMSSA produces output that can be used for OS, and the output of the OS may be the subset of the multiple modes of the inspection subsystem used for the inspection. The output from discovery analysis may include a list of defects (DOI) and corresponding sensitivity-limiting nuisance examples for OS analysis. In addition, the output may include signal, separability, and discovery efficiency trends among the discovery modes to aid the mode selection of OS analysis. OS may be performed then in any suitable manner and as described further herein.

The computer subsystem(s) may also select (and/or rank) modes based on the separability and discovery efficiency scores. For example, in one embodiment, selecting the subset of the multiple modes is performed based on the one or more separability scores in combination with the one or more discovery efficiencies. In particular, as described further herein, any of the scores or other quantitative measures determined by the computer subsystem(s) may be used to determine trends or another characteristic of the optics modes. The trends may also be determined as a change from mode-to-mode, e.g., from best to worst or from worst to best depending on the score or measure. Therefore, the trends may effectively rank the optics modes based on those trends from best to worst or vice versa. In one such example, the trends and/or ranks of the optics modes based on one score or measure can be used in combination with another score or measure to then re-rank the optics modes based on the more than one score or rank. The optics modes may then be selected by the computer subsystem(s) for OS session based on the modified rankings of the optics modes.

In another embodiment, the computer subsystem(s) are configured for determining an overall metric for each of the one or more of the multiple modes thereby generating one or more overall metrics, and the overall metric for each of the one or more modes is defined as a function of the separability score and the discovery efficiency for one of the modes. For example, the discovery efficiency and the separability metric may be merged into one combined metric. In one such example, the overall metric may be determined as a sum of the different measures or scores (e.g., overall metric=discovery efficiency+separability score). However, the overall metric may be determined based on any other suitable function of the separability score, the discovery efficiency, any other scores or quantitative measures described herein, trends, ranks, etc. Such functions may include, for example, a weighted sum, a difference, a product, a polynomial, an average, and the like.

In one such embodiment, selecting the subset of the multiple modes is performed based on the one or more overall metrics thereby also selecting the subset of the multiple modes based on the one or more separability scores. Selecting the subset of the multiple modes based on the one or more overall metrics may be performed as described further herein. The subset may be only one of the modes or more than one of the modes.

In one embodiment, selecting the subset of the multiple modes includes selecting an initial subset of the multiple modes based on the one or more separability scores, performing the scanning with the initial subset of the multiple modes, repeating the determining the separability score step for the initial subset of the multiple modes, and selecting a final subset of the multiple modes for the inspection of the other specimens of the same type as the specimen based on the one or more separability scores determined for the initial subset of the multiple modes. For example, after the OMSSA or OS session, OMSSA or OS may output a few (e.g., 3 to 5) top modes. If these top modes are output by the OMSSA, the computer subsystem(s) may use the inspection subsystem to perform another specimen scan or scans with adaptive discovery, which may be performed as described further herein. This adaptive discovery may include the defects already found in the OMSSA phase of the embodiments. The computer subsystem(s) may then repeat the separability analysis in OMSSA to arrive at the top mode. That top mode or modes may then be designated as the final subset of the multiple modes and used for inspection of the other specimens. For example, each defect type may have its own optimal mode, which in turn could lead to multi-pass (multi-optics mode) inspection.

The embodiments described herein have a number of advantages over other currently used methods and systems for mode selection. For example, the embodiments described herein define new defect-nuisance separability and discovery efficiency metrics for each defect type and optics mode based on information generated during adaptive discovery. This type of quantitative scoring methodology is not available today during OS setup sessions. In addition, the data generated during adaptive discovery may also be mined to make more comprehensive and more accurate determinations about which defects should be used in the OS session and which modes should not be explored further or at all. Furthermore, the embodiments described herein provide information for OS that is far more granular than is currently available. The analytic power of OMSSA will make it possible to identify the best nuisance events to analyze across all of the modes for each defect type. Each optics mode may have a different type of nuisance that limits the sensitivity to the DOI. OMSSA can find the union of all nuisance events needed for all of the optics modes. In addition, the embodiments described herein reduce the time-to-results and increase the ease of use of the OS compared to currently used and other possible methods and systems for OS. For example, one alternative to the embodiments described herein is to eliminate OS image grab and analysis entirely and instead perform discovery with more modes. However, OS image grabs are substantially expensive, taking about 5 hours to about 8 hours of tool time with manual analysis afterwards. Instead, in the embodiments described herein, this time can be used for more exhaustive discovery.

Each of the embodiments of the system described herein may be combined with any other embodiments of the system described herein.

Another embodiment relates to a computer-implemented method for selecting a mode for inspection of a specimen. The method includes determining a separability score for each of one or more of multiple modes of an inspection subsystem thereby generating one or more of the separability scores. The separability score for each of the one or more modes is defined as described herein. The inspection subsystem is configured as described herein. The method also includes selecting a subset of the multiple modes of the inspection subsystem for inspection of other specimens of the same type as the specimen based on the one or more separability scores. The determining the separability score step and the selecting the subset step are performed by the computer system.

Each of the steps of the method may be performed as described further herein. The method may also include any other step(s) that can be performed by the inspection subsystem and/or computer subsystem(s) or system(s) described herein. The steps of the method are performed by one or more computer subsystems, which may be configured according to any of the embodiments described herein. In addition, the method described above may be performed by any of the system embodiments described herein.

Figure 3:
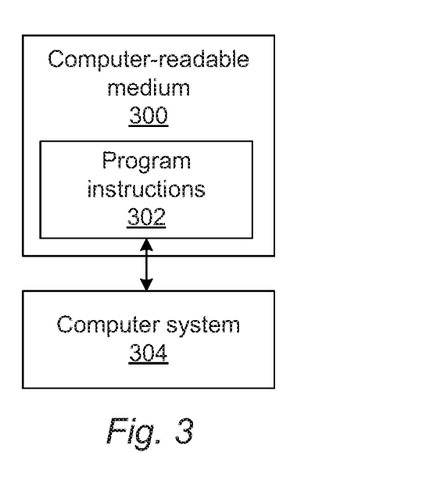
FIG. 3 is a block diagram illustrating one embodiment of a non-transitory computer-readable medium storing program instructions executed on a computer system for performing one or more of the computer-implemented methods described herein.

An additional embodiment relates to a non-transitory computer-readable medium storing program instructions executed on a computer system for performing a computer-implemented method for selecting a mode for inspection of a specimen. One such embodiment is shown in FIG. 3. In particular, as shown in FIG. 3, non-transitory computer-readable medium 300 includes program instructions 302 executable on computer system 304. The computer-implemented method may include any step(s) of any method(s) described herein.

Program instructions 302 implementing methods such as those described herein may be stored on computer-readable medium 300. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), SSE (Streaming SIMD Extension) or other technologies or methodologies, as desired.

Computer system 304 may be configured according to any of the embodiments described herein.

All of the methods described herein may include storing results of one or more steps of the method embodiments in a computer-readable storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. For example, information for the selected mode(s) may be stored in an inspection recipe such that when the inspection is performed for the other specimens with the inspection recipe, the selected mode(s) will be used for generating the output for the other specimens.

Further modifications and alternative embodiments of various aspects of the invention will be apparent to those skilled in the art in view of this description. For example, methods and systems for selecting a mode for inspection of a specimen are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured to select a mode for inspection of a specimen, comprising:
   an inspection subsystem configured for generating output for a specimen by scanning the specimen with energy and detecting energy from the specimen during the scanning, wherein the inspection subsystem is further configured for generating the output with multiple modes defined by different values of at least one parameter of the inspection subsystem used for generating the output; and
   one or more computer subsystems configured for:
       determining a separability score for each of one or more of the multiple modes thereby generating one or more separability scores, wherein the separability score for each of the one or more modes is defined by a difference between results of a classifier for defects having a first defect of interest type detected on the specimen using the output generated with one of the multiple modes and the results of the classifier for nuisances detected on the specimen using the output generated with the one of the multiple modes;
       determining a discovery efficiency for each of the one or more of the multiple modes thereby generating one or more discovery efficiencies, wherein the discovery efficiency for each of the one or more modes is defined by a number of defects of interest captured using the output generated with one of the modes; and
       selecting a subset of the multiple modes of the inspection subsystem for inspection of other specimens of the same type as the specimen based on the one or more separability scores in combination with the one or more discovery efficiencies.

2. The system of claim 1, wherein the one or more computer subsystems are further configured for determining an overall metric for each of the one or more of the multiple modes thereby generating one or more overall metrics, and wherein the overall metric for each of the one or more modes is defined as a function of the separability score and the discovery efficiency for one of the modes.

3. The system of claim 2, wherein selecting the subset of the multiple modes is performed based on the one or more overall metrics thereby also selecting the subset of the multiple modes based on the one or more separability scores and the one or more discovery efficiencies.

4. The system of claim 1, wherein the one or more computer subsystems are further configured for detecting events on the specimen using the output generated during the scanning with the multiple modes and for inputting the events into the classifier to thereby separate the events into the defects and the nuisances.

5. The system of claim 4, wherein the one or more computer subsystems are further configured for displaying the defects and the nuisances to a user and receiving a selection of one or more of the defects and one or more of the nuisances from the user.

6. The system of claim 5, wherein the one or more computer subsystems are further configured for receiving input from the user indicating which of the one or more of the defects have the same type.

7. The system of claim 5, wherein the one or more computer subsystems are further configured for determining another separability score for each of the one or more of the defects selected by the user thereby generating one or more other separability scores, and wherein the other separability score for each of the one or more of the defects is defined by a difference between the results of the classifier for one of the defects selected by the user and detected on the specimen using the output generated with the one of the multiple modes compared to the results of the classifier for the nuisances detected on the specimen using the output generated with the one of the modes.

8. The system of claim 7, wherein the one or more computer subsystems are further configured for selecting a subset of the one or more of the defects selected by the user based on the one or more other separability scores to thereby select at least one of the one or more of the defects having the lowest values of the one or more other separability scores, and wherein selecting the subset of the multiple modes is performed based on the one or more separability scores in combination with the one or more other separability scores.

9. The system of claim 1, wherein the one or more computer subsystems are further configured for determining a characteristic of the one or more separability scores for at least a portion of the multiple modes.

10. The system of claim 1, wherein the one or more computer subsystems are further configured for detecting events on the specimen using the output generated during the scanning with the multiple modes as input to a defect detection method, inputting the events into the classifier to thereby separate the events into the defects and the nuisances, altering one or more parameters of the defect detection method, repeating the detecting the events step with the one or more altered parameters of the defect detection method, and inputting the events detected by the detecting step and the repeating the detecting step into the classifier to thereby separate the events into the defects and the nuisances.

11. The system of claim 10, wherein altering the one or more parameters of the defect detection method comprises identifying a portion of the multiple modes expected to be capable of detecting the defects in greater numbers than another portion of the multiple modes and selecting only the output generated during the scanning performed with the identified portion of the multiple modes as the input to the defect detection method.

12. The system of claim 1, wherein selecting the subset of the multiple modes comprises selecting an initial subset of the multiple modes based on the one or more separability scores, performing the scanning with the initial subset of the multiple modes, repeating the determining the separability score step for the initial subset of the multiple modes, and selecting a final subset of the multiple modes for the inspection of the other specimens of the same type as the specimen based on the one or more separability scores determined for the initial subset of the multiple modes in combination with the one or more discovery efficiencies.

13. The system of claim 1, wherein the classifier is configured as a nuisance filter.

14. The system of claim 1, wherein the specimen comprises a wafer.

15. The system of claim 1, wherein the energy scanned over the specimen comprises light, and wherein the energy detected from the specimen comprises light.

16. The system of claim 1, wherein the energy scanned over the specimen comprises electrons, and wherein the energy detected from the specimen comprises electrons.

17. A non-transitory computer-readable medium, storing program instructions executed on a computer system for performing a computer-implemented method for selecting a mode for inspection of a specimen, wherein the computer-implemented method comprises:

determining a separability score for each of one or more of multiple modes of an inspection subsystem thereby generating one or more separability scores, wherein the separability score for each of the one or more modes is defined by a difference between results of a classifier for defects having a first defect of interest type detected on a specimen using output generated by one of the multiple modes and the results of the classifier for nuisances detected on the specimen using the output generated by the one of the multiple modes, wherein the inspection subsystem is configured for generating the output for the specimen by scanning the specimen with energy and detecting energy from the specimen during the scanning, and wherein the inspection subsystem is further configured for generating the output with the multiple modes defined by different values of at least one parameter of the inspection subsystem used for generating the output;

determining a discovery efficiency for each of the one or more of the multiple modes thereby generating one or more discovery efficiencies, wherein the discovery efficiency for each of the one or more modes is defined by a number of defects of interest captured using the output generated with one of the modes; and selecting a subset of the multiple modes of the inspection subsystem for inspection of other specimens of the same type as the specimen based on the one or more separability scores in combination with the one or more discovery efficiencies, wherein determining the separability score step, determining the discovery efficiency step, and selecting the subset step are performed by the computer system.

18. A computer-implemented method for selecting a mode for inspection of a specimen, comprising:

determining a separability score for each of one or more of multiple modes of an inspection subsystem thereby generating one or more separability scores, wherein the separability score for each of the one or more modes is defined by a difference between results of a classifier for defects having a first defect of interest type detected on a specimen using output generated by one of the multiple modes and the results of the classifier for nuisances detected on the specimen using the output generated by the one of the multiple modes, wherein the inspection subsystem is configured for generating the output for the specimen by scanning the specimen with energy and detecting energy from the specimen during the scanning, and wherein the inspection subsystem is further configured for generating the output with the multiple modes defined by different values of at least one parameter of the inspection subsystem used for generating the output;

determining a discovery efficiency for each of the one or more of the multiple modes thereby generating one or more discovery efficiencies, wherein the discovery efficiency for each of the one or more modes is defined by a number of defects of interest captured using the output generated with one of the modes; and selecting a subset of the multiple modes of the inspection subsystem for inspection of other specimens of the same type as the specimen based on the one or more separability scores in combination with the one or more discovery efficiencies, wherein determining the separability score step, determining the discovery efficiency step, and selecting the subset step are performed by one or more computer subsystems.

19. A system configured to select a mode for inspection of a specimen, comprising:

an inspection subsystem configured for generating output for a specimen by scanning the specimen with energy and detecting energy from the specimen during the scanning, wherein the inspection subsystem is further configured for generating the output with multiple modes defined by different values of at least one parameter of the inspection subsystem used for generating the output; and one or more computer subsystems configured for:

detecting events on the specimen using the output generated during the scanning with the multiple modes and for inputting the events into a classifier to thereby separate the events into defects and nuisances;

determining a separability score for each of one or more of the multiple modes thereby generating one or more separability scores, wherein the separability score for each of the one or more modes is defined by a difference between results of the classifier for the defects having a first defect of interest type detected on the specimen using the output generated with one of the multiple modes and the results of the classifier for the nuisances detected on the specimen using the output generated with the one of the multiple modes;

displaying the defects and the nuisances to a user and receiving a selection of one or more of the defects and one or more of the nuisances from the user;

determining another separability score for each of the one or more of the defects selected by the user thereby generating one or more other separability scores, wherein the other separability score for each of the one or more of the detects is defined by a difference between the results of the classifier for one of the defects selected by the user and detected on the specimen using the output generated with the one of the multiple modes compared to the results of the classifier for the nuisances detected on the specimen using the output generated with the one of the modes; and selecting a subset of the multiple modes of the inspection subsystem for inspection of other specimens of the same type as the specimen based on the one or more separability scores.

20. The system of claim 19, wherein the one or more computer subsystems are further configured for receiving input from the user indicating which of the one or more of the defects have the same type.

21. The system of claim 19, wherein the one or more computer subsystems are further configured for selecting a subset of the one or more of the defects selected by the user based on the one or more other separability scores to thereby select at least one of the one or more of the defects having the lowest values of the one or more other separability scores, and wherein selecting the subset of the multiple modes is performed based on the one or more separability scores in combination with the one or more other separability scores.

22. A system configured to select a mode for inspection of a specimen, comprising:

an inspection subsystem configured for generating output for a specimen by scanning the specimen with energy and detecting energy from the specimen during the scanning, wherein the inspection subsystem is further configured for generating the output with multiple modes defined by different values of at least one parameter of the inspection subsystem used for generating the output; and one or more computer subsystems configured for:

determining a separability score for each of one or more of the multiple modes thereby generating one or more separability scores, wherein the separability score for each of the one or more modes is defined by a difference between results of a classifier for defects having a first defect of interest type detected on the specimen using the output generated with one of the multiple modes and the results of the classifier for nuisances detected on the specimen using the output generated with the one of the multiple modes; and selecting a subset of the multiple modes of the inspection subsystem for inspection of other specimens of the same type as the specimen based on the one or more separability scores, wherein selecting the subset of the multiple modes comprises selecting an initial subset of the multiple modes based on the one or more separability scores, performing the scanning with the initial subset of the multiple modes, repeating the determining the separability score step for the initial subset of the multiple modes, and selecting a final subset of the multiple modes for the inspection of the other specimens of the same type as the specimen based on the one or more separability scores determined for the initial subset of the multiple modes.

* * * * *